United States Patent
Kim et al.

(10) Patent No.: US 9,349,651 B2
(45) Date of Patent: May 24, 2016

(54) SEMICONDUCTOR DEVICE AND METHOD FOR FABRICATING THE SAME

(71) Applicants: Jong-Su Kim, Seoul (KR); Hee-Young Go, Seoul (KR); Sang-Jin Kim, Suwon-si (KR); Yong-Kug Bae, Hwaseong-si (KR); Il-Young Yoon, Hwaseong-si (KR)

(72) Inventors: Jong-Su Kim, Seoul (KR); Hee-Young Go, Seoul (KR); Sang-Jin Kim, Suwon-si (KR); Yong-Kug Bae, Hwaseong-si (KR); Il-Young Yoon, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/802,643

(22) Filed: Jul. 17, 2015

(65) Prior Publication Data
US 2016/0020149 A1 Jan. 21, 2016

(30) Foreign Application Priority Data
Jul. 18, 2014 (KR) .................... 10-2014-0091051

(51) Int. Cl.
| | |
|---|---|
| *H01L 21/336* | (2006.01) |
| *H01L 21/8234* | (2006.01) |
| *H01L 21/82* | (2006.01) |
| *H01L 29/66* | (2006.01) |
| *H01L 21/66* | (2006.01) |
| *H01L 23/544* | (2006.01) |
| *H01L 21/762* | (2006.01) |

(52) U.S. Cl.
CPC .. *H01L 21/823431* (2013.01); *H01L 21/76224* (2013.01); *H01L 21/82* (2013.01); *H01L 21/823456* (2013.01); *H01L 21/823468* (2013.01); *H01L 21/823481* (2013.01); *H01L 22/20* (2013.01); *H01L 23/544* (2013.01); *H01L 29/66545* (2013.01); *H01L 2223/5446* (2013.01); *H01L 2223/54426* (2013.01)

(58) Field of Classification Search
CPC ............ H01L 21/823431; H01L 21/82; H01L 21/823456; H01L 29/66545; H01L 22/20; H01L 21/823468
USPC .................................................. 438/288, 296
See application file for complete search history.

(56) References Cited

U.S. PATENT DOCUMENTS

| | | | | |
|---|---|---|---|---|
| 7,309,634 | B2 * | 12/2007 | Hong ................ | H01L 27/11521 257/E21.051 |
| 8,044,490 | B2 * | 10/2011 | Shin .................... | H01L 23/5258 257/209 |
| 2013/0045580 | A1 * | 2/2013 | Cho ................ | H01L 21/823431 438/296 |
| 2015/0076499 | A1 * | 3/2015 | Wann ................ | H01L 21/76224 257/48 |

* cited by examiner

*Primary Examiner* — Savitr Mulpuri
(74) *Attorney, Agent, or Firm* — Muir Patent Law, PLLC

(57) ABSTRACT

Provided are a semiconductor device and a method for fabricating the same. The semiconductor device includes a substrate including a circuit region and a scribe lane region, an active fin protruding from the substrate in the circuit region, a first gate structure extending over the active fin in the circuit region, and a second gate structure formed in the scribe lane region.

14 Claims, 22 Drawing Sheets

14

1200

1300

1400

SEMICONDUCTOR DEVICE AND METHOD FOR FABRICATING THE SAME

CROSS-REFERENCE TO RELATED APPLICATION

This application claims priority to Korean Patent Application No. 10-2014-0091051 filed on Jul. 18, 2014 in the Korean Intellectual Property Office under 35 U.S.C. 119, the contents of which are herein incorporated by reference in their entirety.

BACKGROUND

In fabricating a semiconductor device, it is often desired to accurately align upper and lower layers. To this end, overlay accuracy can be achieved by forming monitoring patterns (or keys). The monitoring patterns may be formed in, for example, a scribe lane region of a wafer, between semiconductor devices (which may be later separated or singulated from each other), e.g., to avoid affecting the operation of circuits of a semiconductor device formed in the circuit region. A scribe region may be an area between semiconductor devices integrally formed in a wafer such that separation of the semiconductor devices from each other along the scribe region (e.g., by cutting the wafer at the scribe region) would not affect normal operations of the semiconductor devices. However, the monitoring patterns may be damaged by, for example, a chemical mechanical polishing (CMP) process in fabricating the semiconductor device. In order to achieve accurate alignment of upper and lower layers, the monitoring patterns should remain at least to a substantial amount even after being damaged during a particular process.

Korean Patent No. 0887064 discloses an overlay venires and a forming method thereof.

SUMMARY

The present inventive concept provides a semiconductor device for improving the reliability using monitoring patterns.

The present inventive concept also provides a method for fabricating a semiconductor device with monitoring patterns from being completely damaged.

In some embodiments, a method of manufacturing a semiconductor device, comprises providing a semiconductor wafer, the semiconductor wafer comprising at least a first circuit region and a first scribe lane adjacent the first circuit region; and separating the first circuit region from the wafer to provide the semiconductor device, including providing a separation along the first scribe lane, wherein, the first circuit region comprises: a first portion of a substrate provided with a first fin shaped active region and a second fin shaped active region, the first fin shaped active region adjacent the second fins shaped region defining a trench therebetween, a first portion of a device isolation insulating layer formed over the substrate having a height lower than top surfaces of the first fin shaped active region and the second fin shaped active region, and formed on sidewalls of the first fin shaped active region, sidewalls of the second fin shaped active region and in the trench formed between the first fin shaped active region and the second fin shaped active region, a first gate structure formed to cross over top surfaces of the first fin shaped active region and the second fin shaped active region and the insulating material in the trench, wherein the first scribe lane region comprises: a second portion of the substrate, a second portion of the device isolation insulating layer formed over the second portion of the substrate and a monitoring pattern comprising a second gate structure, wherein the first gate structure and the second gate structure are formed from the same material layers, and a height of a bottom surface of the second gate structure of the first scribe lane region is different from a height of a bottom surface of the first gate structure of the first circuit region.

A height of a bottom surface of the second gate structure of the first scribe lane region may be lower than a height of a bottom surface of the first gate structure of the circuit region, which is disposed on the top surfaces of the first and second active regions.

The entire bottom surface of the second gate structure may have a maximum height that is less than a height of a portion of the bottom surface of the first gate structure.

The second gate structure may be directly formed on the insulating layer in the first scribe lane region.

A distance from a top surface of the second portion of the device isolation insulating layer to the top surface of the second gate structure in the first scribe lane region may be greater than a distance from the top surface of the first fin shaped active region to the top surface of the first gate structure in the first circuit region.

A height of the top surface of the second portion of the device isolation insulation layer in the scribe lane region may be lower than a height of the top surface of the first fin shaped active region in the circuit region.

The first gate structure and the second gate structure may extend in the same direction.

The first gate structure and the second gate structure may extend in respective directions that are orthogonal to each other.

In some embodiments, a method of manufacturing a semiconductor device comprises providing a semiconductor substrate with a circuit region and a scribe lane region adjacent the circuit region; forming a fin shaped active region in the circuit region; forming a first insulating layer on surfaces of the semiconductor substrate and on lower portions of sidewalls of the fin shaped active region; forming a gate insulation layer in the circuit region and the scribe lane region; forming a gate electrode layer in the circuit region and the scribe lane region; and forming a first gate electrode structure from first portions of the gate insulation layer and gate electrode layer in the circuit region and a second gate electrode structure from second portions of the gate insulation layer and the gate electrode layer in the scribe lane region, wherein the second gate electrode does not overlie any active region.

The second gate electrode may be formed directly on the semiconductor substrate.

The insulating layer may be formed in the scribe lane region and the second gate electrode is formed directly on the first insulating layer.

A bottom surface of the second gate electrode may be lower than a bottom surface of the first gate electrode on the fin shaped active region.

Methods may comprise forming a second insulating layer on the first insulating layer with a first trench in the circuit region and a second trench in the scribe lane region; depositing the gate insulation layer in the first trench and second trench; and depositing the gate electrode layer in the first trench and the second trench on the gate insulation layer.

Depositing the gate insulation layer and the gate electrode layer may comprise depositing the gate insulation layer and the gate electrode layer on the second insulating layer, and the method may further comprise, after depositing the gate electrode layer in the first trench and the second trench, performing a chemical mechanical polishing to remove the portions of the gate insulation layer and the gate electrode layer on the second insulating layer.

Methods may comprise using the second gate electrode to align the formation of subsequent layers on the circuit region.

The gate insulation layer may be deposited on a top surface of the fin shaped active region, upper portions of sidewalls of the fin shaped active region.

Methods may comprise forming a first dummy gate structure over the fin shaped active region and a second dummy gate structure in the scribe lane region; and forming sidewalls along sides of the first dummy gate structure and along sidewalls of the second dummy gate structure.

Methods may comprise forming a second insulating layer on sides of the first and second dummy gate structures; and replacing the first and second dummy gate structures with the first and second gate electrode structures.

Methods may comprise forming a third gate electrode structure from third portions of the gate insulation layer and the gate electrode layer in the scribe lane region, wherein the second gate electrode structure and the third gate electrode structure may form elements of a monitoring pattern.

Lengthwise directions of the second and third electrode structures may extend in directions perpendicular to each other.

The third electrode structure may not overlie any active region.

Methods may comprise forming a finFET in a circuit region of a semiconductor wafer, the finFET comprising a first gate electrode structure; forming a monitoring pattern in a second region adjacent the circuit region, the monitoring pattern comprising a second gate electrode structure; using the monitoring pattern to align a subsequent formation of a structure on the semiconductor wafer; and separating the circuit region from the semiconductor wafer to provide a semiconductor chip, wherein first gate electrode structure and the second gate electrode structure are formed by patterning a layer deposited on the semiconductor wafer.

A minimum thickness in the vertical direction of the second gate electrode may be greater than a minimum thickness in the vertical direction of the first gate electrode.

The finFET may comprise an active fin shaped region extending above a device isolation insulating layer, and the second gate electrode may be formed directly on the device isolation insulating layer.

The second gate electrode may be formed directly on the semiconductor wafer.

Separating the circuit region from the semiconductor wafer may comprise cutting the wafer along a scribe lane, wherein the second region including the monitoring pattern is part of the scribe lane.

BRIEF DESCRIPTION OF THE DRAWINGS

The above and other features and advantages of the present inventive concept will become more apparent by describing in detail preferred embodiments thereof with reference to the attached drawings in which.

DETAILED DESCRIPTION OF THE EMBODIMENTS

Figure 1:
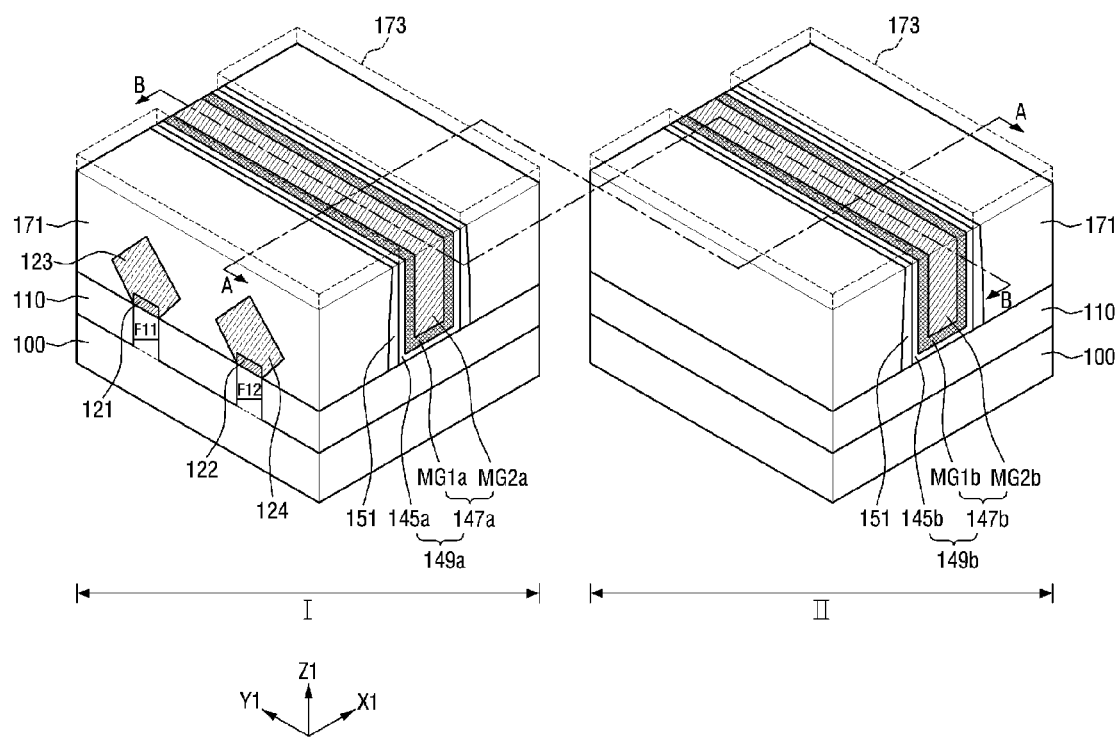
FIG. 1 is a perspective view of a semiconductor device according to an embodiment of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures may be schematic in nature and their shapes may not illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Devices and methods of forming devices according to various embodiments described herein may be embodied in microelectronic devices such as integrated circuits, wherein a plurality of devices according to various embodiments described herein are integrated in the same microelectronic device. Accordingly, cross-sectional view(s) illustrated herein (even if illustrated in a single direction or orientation) may exist in different directions or orientations (which need not be orthogonal or related as set forth in the described embodiments) in the microelectronic device. Thus, a plan view of the microelectronic device that embodies devices according to various embodiments described herein may include a plurality of the devices in an array and/or in a two-dimensional pattern having orientations that may be based on the functionality or other design considerations of the microelectronic device.

The devices according to various embodiments described herein may be interspersed among other devices depending on the functionality of the microelectronic device. Moreover, microelectronic devices according to various embodiments described herein may be replicated in a vertical direction to provide three-dimensional integrated circuits.

The cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and/or transistor structures (and/or memory cell structures, gate structures, etc., as appropriate to the case) that may have a variety of orientations.

Figure 2:
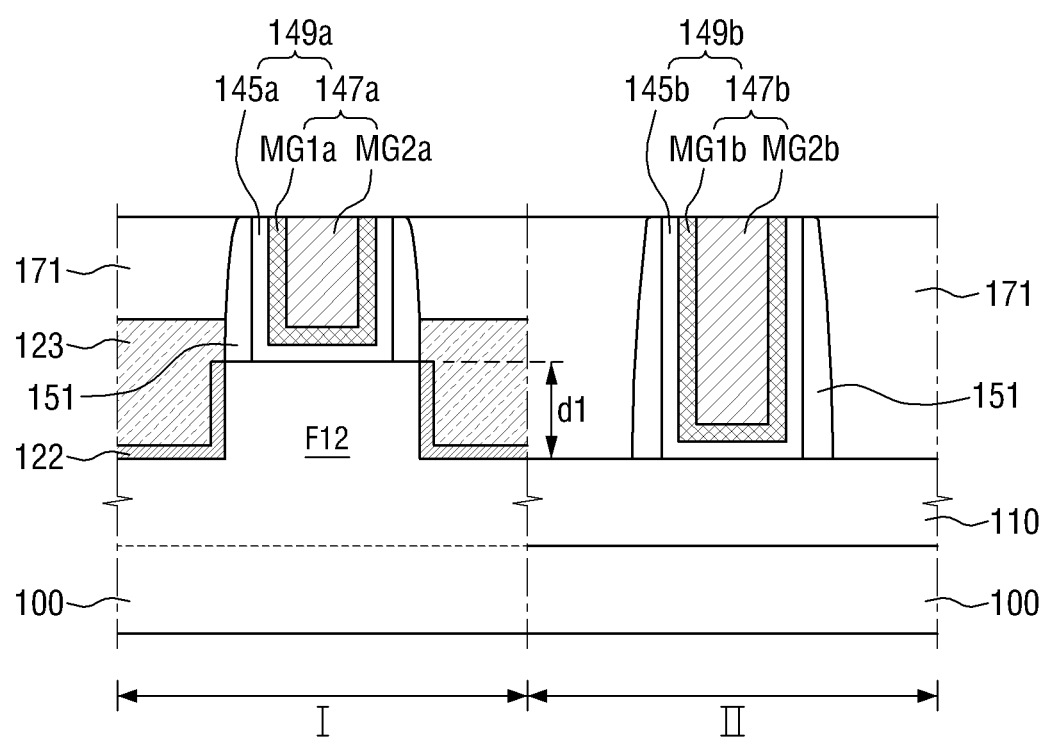
FIG. 2 is a cross-sectional view of the semiconductor device shown in FIG. 1, taken along the line A-A.
Figure 3:
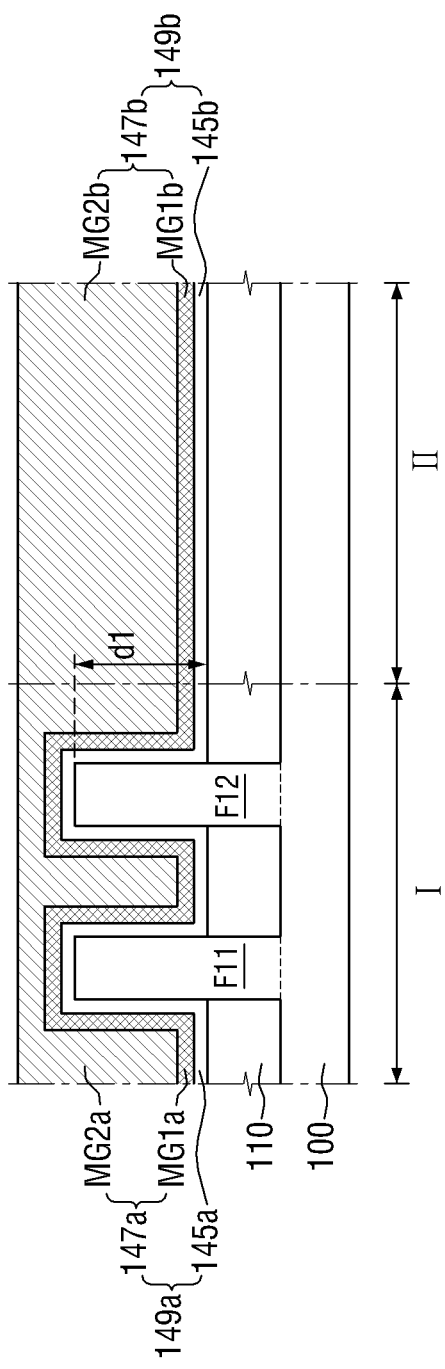
FIG. 3 is a cross-sectional view of the semiconductor device shown in FIG. 1, taken along the line B-B.

Hereinafter, a semiconductor device according to an embodiment of the present inventive concept will be described with reference to FIG. 1 is a perspective view of a semiconductor device according to an embodiment of the present inventive concept, FIG. 2 is a cross-sectional view of the semiconductor device shown in FIG. 1, taken along the line A-A, and FIG. 3 is a cross-sectional view of the semiconductor device shown in FIG. 1, taken along the line B-B.

Referring to FIGS. 1 to 3, the semiconductor device according to an embodiment of the present inventive concept includes a substrate 100, active fins F11 and F12 and gate structures 149a and 149b. The active fins F11 and F12 may form active regions isolated from one another by a device isolation layer, such as insulation layer 110. Active regions may be formed by providing a doped region of a crystalline semiconductor to allow flow of charge carriers (electrons or holes) during appropriate times during normal operation of the semiconductor device.

The substrate 100 may include a circuit region I and a scribe lane region II. The circuit region I includes a region where a circuit of a semiconductor device is formed, such as a logic circuit, memory cell array, etc. The scribe lane region II includes a region where monitoring patterns used for alignment of upper and lower layers for fabricating a semiconductor device are formed.

Figure 22:
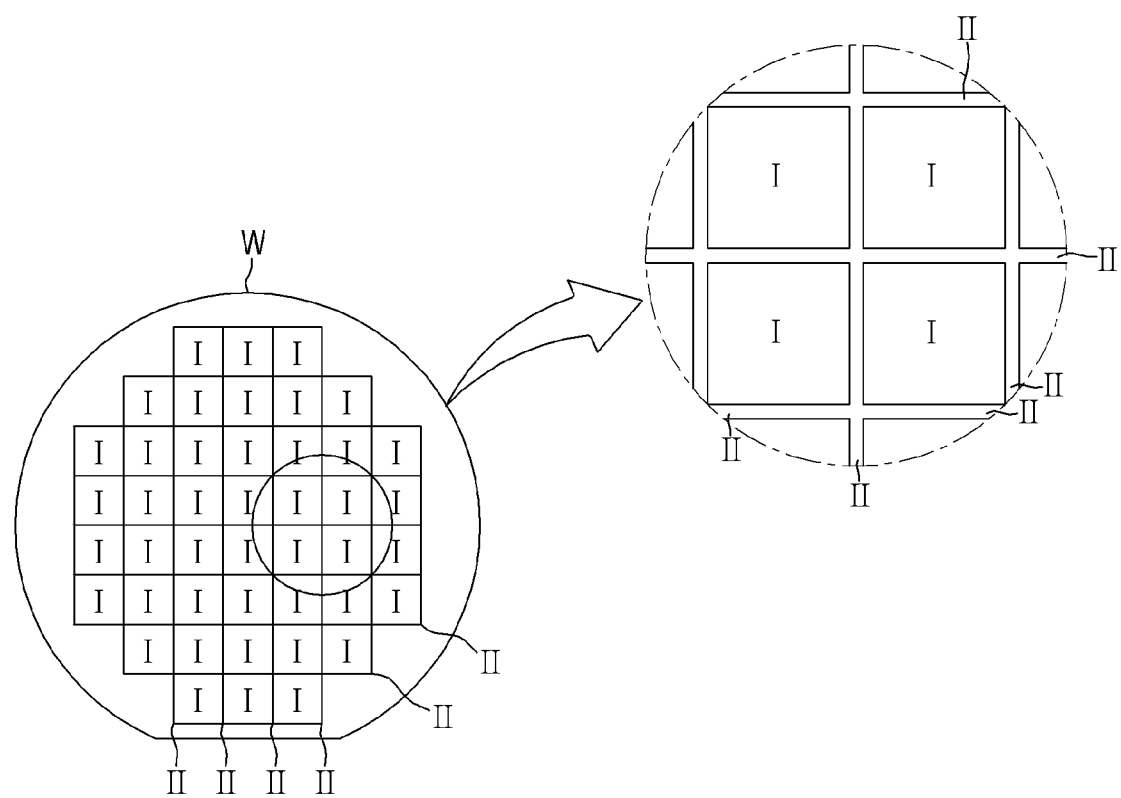
FIG. 22 illustrates a wafer with a plurality of circuit region and scribe lanes.

The scribe lane region II may divide the circuit regions I of different semiconductor devices. For example, the scribe lane region II may be a region formed in a semiconductor wafer in a horizontal or vertical direction. The scribe regions may be regions that where the wafer is cut to separate the different semiconductor devices from each other, such as by using a diamond cutter, in order to the semiconductor wafer into a plurality of chips. In some processes, the scribed wafer may be divided into the plurality of chips by rolling a partially cut wafer using a roller. FIG. 22 illustrates an example embodiment comprising a wafer W with a plurality of circuit regions I separated by scribe lane regions II. The plurality of scribe lane regions II extend in both the horizontal and vertical direction and join in a mesh-like fashion to separate the circuit regions I from each other. The circuit regions I may be physically separated from one another by making horizontal and vertical cuts along corresponding horizontal and vertical scribe lane regions II. The separated circuit regions I may each correspond to semiconductor chips or singulated semiconductor devices. Note that in some embodiments, at least some of the circuit regions I may remain connected and need not be physically separated from one another and may be made operational (e.g., packaged and made part of a larger system) while connected to one another via a scribe region. In some embodiments of the present inventive concept, the monitoring patterns formed in the scribe lane region II are formed by a process that is the same with or similar to a process for forming the actual circuit patterns formed in the circuit region I. In some embodiments of the present inventive concept, the monitoring patterns may be overlay venires or align keys, but aspects of the present inventive concept are not limited thereto. The monitoring patterns may include arbitrary semiconductor patterns for alignment of upper and lower layers.

In some embodiments of the present inventive concept, the substrate 100 may include one or more semiconductor materials such as crystalline Si, Ge, SiGe, GaP, GaAs, SiC, SiGeC, InAs, InP. The substrate 100 may be a homogeneous silicon substrate, a silicon on insulator (SOI) substrate, a gallium arsenic substrate, a silicon germanium substrate, a ceramic substrate, a quartz substrate, a rigid substrate such as a glass substrate for display, or a flexible plastic substrate made of polyimide, polyester, polycarbonate, polyether sulfone, polymethyl methacrylate, polyethylene naphthalate, or polyethylene terephthalate.

Fins, such as active fins F11 and F12 may be formed only in the circuit region I. Fins need not be formed in the scribe lane region II according to some example embodiments. In detail, the active fins F11 and F12 may protrude from the substrate 100 in the circuit region I in a first direction Z1 and may extend in a second direction X1 crossing and perpendicular to the first direction Z1. Each of the active fins F11 and F12 may have a top surface, long sides and short sides. The fins F11 and F12 may be adjacent to each other and have opposite long sides facing each other. In FIG. 1, the long sides lie in a plane parallel with the second direction X1 and the short sides lie in a direction parallel to the third direction Y1, but aspects of the present inventive concept are not limited thereto. For example, the active fin F11 and/or the active fin F12 may extend in the third direction Y1 so that the long sides of one or both of fins F11 and F12 lie in a plane parallel to the third direction Y1 and the short sides of one or both of fins F11 and F12 lie in a plane parallel to the second direction X1. Other orientations are contemplated. In addition, while only two fins are shown in the circuit region I, a large plurality of fins may exist within the circuit region I. Groups of the fins may have their fins in different directions. For example, a first group of fins may extend in the second direction X1 and a second group of fins may extend in the third direction Y1 (a fin extending in a particular direction is intended to convey the direction of the longer dimension of that particular fin). In addition, in many embodiments, fins may face other fins at their short sides. In some embodiments of the present inventive concept, the active fin F11 and the active fin F12 may be portions of the original substrate 100 (e.g., formed by etching trenches in a crystalline wafer substrate) or may be epitaxially grown from the substrate 100.

The semiconductor device according to an embodiment of the present inventive concept may further include an insulation layer (or an isolation layer) 110 in at least one of the circuit region I and the scribe lane region II. In this case, the insulation layer 110 may be formed on the substrate 100 so as to cover portions of side surfaces of the active fins F11 and F12 in the circuit region I.

In the semiconductor device according to an embodiment of the present inventive concept, the gate structures 149a and 149b may be formed in both of the circuit region I and the scribe lane region II. In detail, the gate structure 149a may be formed on the active fins F11 and F12 in the circuit region I and the gate structure 149b may be directly formed on the substrate 100 in the scribe lane region II. In addition, in some embodiments of the present inventive concept, the gate structure 149a may be formed on the active fins F11 and F12 in the circuit region I and the gate structure 149b may be directly formed on the insulation layer 110 in the scribe lane region II.

The gate structure 149a of the circuit region I may extend in a third direction Y1 crossing the second direction X1 and the gate structure 149b of the scribe lane region II may also extend in the third direction Y1. However, in some embodiments of the present inventive concept, the gate structure 149b of the scribe lane region II may extend in a different direction from the direction in which the gate structure 149a of the circuit region I extends. For example, when the gate structure 149a of the circuit region I extends in the third direction Y1, the gate structure 149b of the scribe lane region II may extend in the second direction X1 or the gate structure 149b of the scribe lane region II may extend in a direction oblique to both the second direction X1 and the third direction Y1, for example, in a direction forming a 45 degree angle with both of the second direction X1 an the third direction Y1.

Referring to FIG. 2, in the semiconductor device according to an embodiment of the present inventive concept, the bottom surface of the gate structure 149b of the scribe lane region II may be substantially planar and lie entirely on insulating layer 110 while the bottom surface of the gate structure 149a may have a portions on insulating layer 110 and portions on active fins F11 and F12. Bottom surfaces of the gate structure 149a overlying the top surfaces of active fins F11 and F12 may extend a height d1 over the upper surface of insulating layer 110 (see FIG. 2, e.g.). Bottom surfaces of the gate structure 149a may not be planar and instead undulate, for example, so that gate structure 149a is adjacent portions of the long sides and top surface of each of active fin F11 and F12 (see FIG. 3, e.g.). Portions of gate structure 149a overlying the top surfaces of active fins F11 and F12 may have a smaller height than the height of gate structure 149b and the height of remaining portions of gate structure 149a. Top surfaces of gate structures 149a and 149b may be substantially planar and lie in the same plane so that they are at the same height. In addition, the top surfaces of the insulation layer 110 in both the circuit region I and in the scribe lane region II may be lower than top surface of the active fin F11 and the top surface of the active fin F12 in the circuit region I.

In some embodiments of the present inventive concept, the gate structures 149a and 149b respectively formed in the circuit region I and the scribe lane region II may be simultaneously formed by the same process or similar processes. FIG. 2 illustrates that the heights of the top surfaces of the gate structures 149a and 149b become identical with each other by performing a chemical mechanical polishing (CMP) process on the gate structures 149a and 149b, although these portions of the gate structures 149a and 149b have a height difference of d1. It should be noted that typical manufacturing process variations may be expected, such as due to "dishing" that may occur during the CMP process. In some examples, dishing may cause a significant difference in height of the top of gate structures 149a and 149b. As the thickness (in the height direction) of the gate structure 149b is made larger than that of the gate structure 149a (at least at the location over active fins, such as active fins F11 and F12), the gate structure 149b may still remain to allow for its detection when used as a monitoring pattern.

As shown in FIGS. 1 to 3, in the semiconductor device according to an embodiment of the present inventive concept, even when the scribe lane region II including monitoring patterns is etched (which may cause damage to the monitoring patterns), portions of the monitoring patterns will remain. Accordingly, alignment of upper and lower layers may be performed using the monitoring pattern remaining in the scribe lane region II. Thus, even if the monitoring patterns formed in the scribe lane region II are damaged severely enough due to a large etch of the actual pattern formed in the circuit region I, a considerable amount of the monitoring patterns still remain, thereby providing the monitoring patterns having ensured reliability. The monitoring patterns may be used to align the formation of additional elements on the structure illustrated in FIGS. 1-3, such as on the circuit region I, e.g., such as by detecting the location of the monitoring pattern by scanning the wafer W (e.g., with light or other appropriate electromagnetic radiation).

In some embodiments of the present inventive concept, the gate structures 149a and 149b may include gate insulation layers 145a and 145b and gate electrodes 147a and 147b. The following description will focus on the gate structure 149a, the gate insulation layer 145a and the gate electrode 147a, but it is also appreciated that the present inventive concept may also be applied to the gate structure 149b, the gate insulation layer 145b and the gate electrode 147b.

The gate insulation layers 145a may be disposed between the gate electrode 147a and the substrate 100 or the insulation layer 110. The gate insulation layer 145a may be formed between the active fins F11 and F12 and the gate electrode 147a. As shown in FIG. 3, the gate insulation layer 145a may be formed on the top surface and upper portions of side surfaces of the active fin F11 and the top surface and upper portions of side surfaces of the active fin F12. The gate insulation layer 145b may be directly formed on the insulation layer 110. In some embodiments of the present inventive concept, as shown in FIGS. 1 and 2, the gate insulation layers 145a and 145b may extend upwardly and along sidewalls of the spacer 151 to be described later.

The gate electrode 147a may be formed by stacking two or more metal layers. For example, the gate electrode 147a may include metal layers MG1a and MG2a. Here, the metal layer MG1a may function to adjust a work function, and the metal layer MG2a may fill a space formed by the first metal layer MG1a.

In some embodiments of the present inventive concept, spacers 151 may be formed on the sidewalls (e.g., vertical outer surfaces) of the gate structures 149a and 149b. The spacer 151 may include at least one of a nitride layer, an oxynitride layer, and a low-k material layer. In addition, the spacer 151 having one side surface is illustrated to include a curved profile in FIGS. 1 and 2, but aspects of the present inventive concept are not limited thereto. The spacer 151 may have a different shape from that illustrated herein. For example, the gate spacer 151 may have an I- or L-letter cross sectional profile, unlike in the shape illustrated herein. In addition, the spacer 151 formed of a single layer is illustrated, but aspects of the present inventive concept are not limited thereto. The spacer 151 may be formed of multiple layers.

Figure 4:
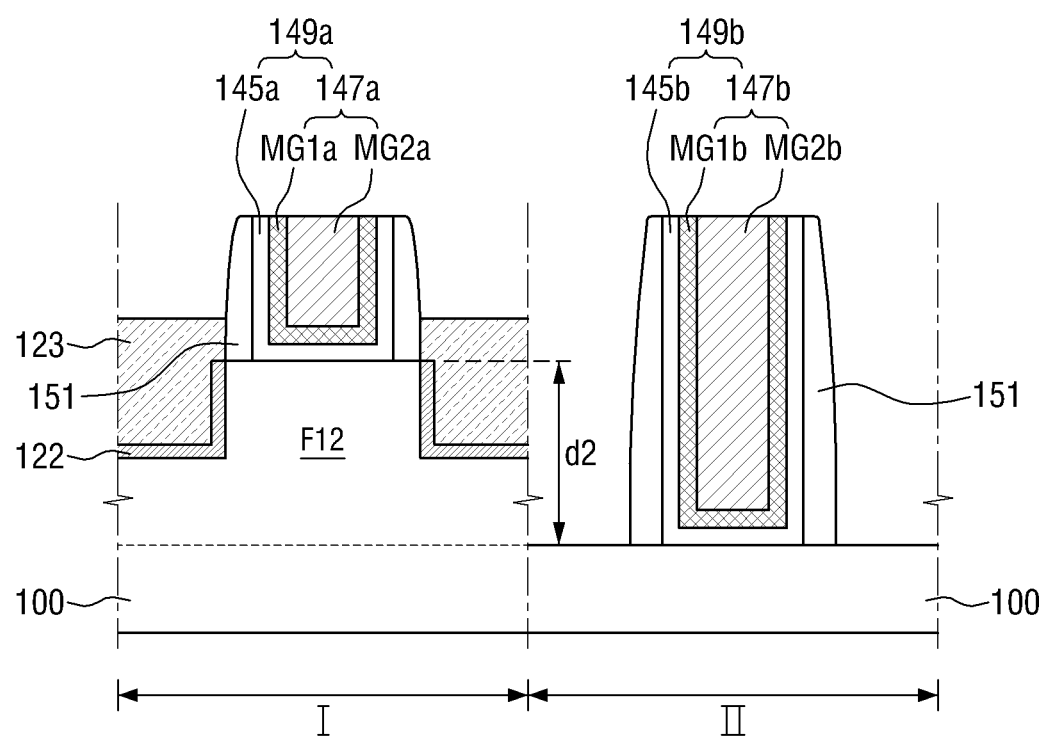
FIG. 4 is a cross-sectional view of a semiconductor device according to another embodiment of the present inventive concept.

FIG. 4 is a cross-sectional view of a semiconductor device according to another embodiment of the present inventive concept.

Referring to FIG. 4, according to another embodiment, the gate structure 149a is formed on the active fins F11 and F12 in the circuit region I and the gate structure 149b is directly formed on the substrate 100 in the scribe lane region II. Here, the bottom surface of the gate structure 149b of the scribe lane region II may be substantially planar and formed directly on substrate 100. Insulating layer 110 may not be formed in the scribe lane region II. The lowermost surface of the gate structure 149b may be at a lower height than the lowermost surface of the gate structure 149a (which may have the same structure as the gate structure 149a in the first embodiment shown in FIGS. 1-3). The lowermost surface of the gate structure 149b may have a height difference d2 with a lower surface of the gate structure 149a overlying active fin F11 and F12.

In some embodiments of the present inventive concept, the gate structures 149a and 149b respectively formed in the circuit region I and the scribe lane region II may be simultaneously formed by the same process or similar processes. In this case, due to the height difference d2, a length ranging from a top surface of the substrate 100 to a top surface of the second gate structure 149b in the scribe lane region II may be greater than a length ranging from the top surface of the active fin F12 in the circuit region I to the top surface of the gate structure 149a in the circuit region I. FIG. 4 illustrates that the heights of the top surfaces of the gate structures 149a and 149b may be identical with each other after performing a chemical mechanical polishing (CMP) process to form the gate structures 149a and 149b, while the gate structures 149a and 149b may be have a thickness difference of d2.

However, even when the scribe lane region II including monitoring patterns is over-etched or damaged during the CMP process or other process, portions of the monitoring patterns are more likely to remain due to their increased thickness (e.g., in the height direction) as compared to the gate structures 149a in the circuit regions I. Accordingly, alignment of upper and lower layers may be performed using the monitoring pattern remaining in the scribe lane region II. That is to say, in the semiconductor device according to another embodiment of the present inventive concept, even if the monitoring patterns formed in the scribe lane region I are damaged severely enough to almost entirely etch the actual pattern formed in the circuit region I, a considerable amount of the monitoring patterns still remain, thereby providing the monitoring patterns having increased reliability.

Figure 5:
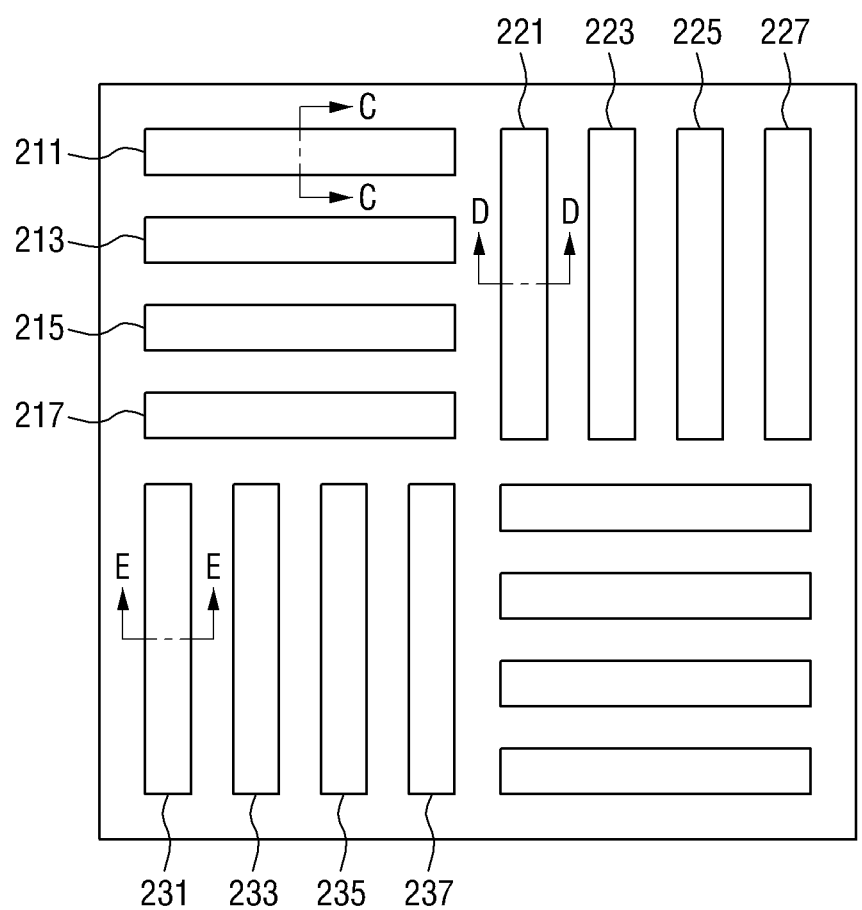
FIG. 5 is a top view illustrating a scribe lane region of a semiconductor device according to an embodiment of the present inventive concept.

FIG. 5 is a top view illustrating a a portion of a scribe lane region II of a semiconductor device according to an embodiment of the present inventive concept.

Referring to FIG. 5, in the semiconductor device according to an embodiment of the present inventive concept, one or more monitoring patterns are formed in a scribe lane region. For example, the one or more monitoring patterns formed in the scribe lane region may include first monitoring patterns 211, 213, 215 and 217 and second monitoring patterns 221, 223, 225 and 227. As described above, the monitoring patterns may be used for alignment of upper and lower layers in the course of fabricating the semiconductor device, and may be formed in the same process with or a similar process to an actual cell, die or pattern formed in a circuit region, thereby reflecting characteristics of the actual cell, die or pattern formed in the circuit region as they are.

In some embodiments of the present inventive concept, the first monitoring patterns 211, 213, 215 and 217 and the second monitoring patterns 221, 223, 225 and 227 may be patterns of the same type. For example, the first monitoring patterns 211, 213, 215 and 217 and the second monitoring patterns 221, 223, 225 and 227 are all gate structures. However, in some other embodiments of the present inventive concept, the first monitoring patterns 211, 213, 215 and 217 and the second monitoring patterns 221, 223, 225 and 227 are arbitrary semiconductor patterns for alignment of upper and lower layers and may be patterns of different types. Meanwhile, as shown in FIG. 5, the first monitoring patterns 211, 213, 215 and 217 and the second monitoring patterns 221, 223, 225 and 227 may have lengths that extend in different directions.

In the following description, for the sake of convenient explanation, it is assumed that a portion of the scribe lane region having the first monitoring patterns 211, 213, 215 and 217 is referred to by a scribe lane region III and a portion of the scribe lane region having the second monitoring patterns 221, 223, 225 and 227 is referred to by a scribe lane region IV.

Figure 6:
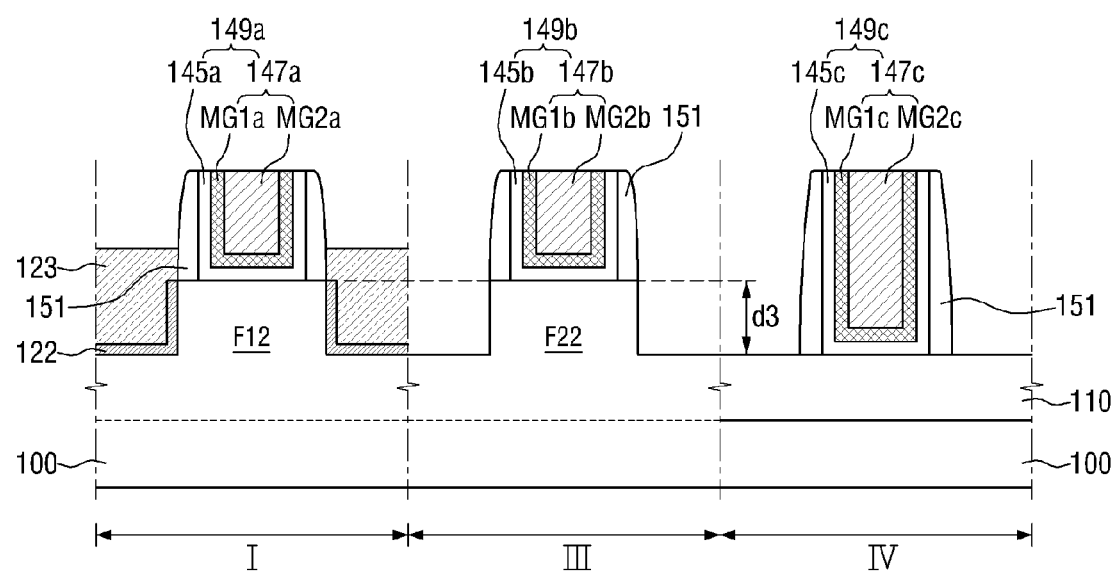
FIG. 6 is a cross-sectional view of a semiconductor device according to another embodiment of the present inventive concept.

FIG. 6 is a cross-sectional view of a semiconductor device according to another embodiment of the present inventive concept.

Referring to FIGS. 5 and 6, the semiconductor device according to another embodiment of the present inventive concept may include a circuit region I, a scribe lane region III and a scribe lane region IV. That is to say, the scribe lane region III shown in FIG. 6 may correspond to a cross section taken along the line C-C of FIG. 5, and the scribe lane region IV shown in FIG. 6 may correspond to a cross section taken along the line D-D of FIG. 5.

In the semiconductor device according to the embodiment FIG. 6, active fins F12 and F22 may be formed in the circuit region I and the scribe lane region III but may not be formed in the scribe lane region IV. That is to say, the semiconductor device according to another embodiment of the present inventive concept is different from the semiconductor device according to the previous embodiment shown in FIGS. 1 to 3 in that the active fin F22 is formed in a portion of the scribe lane region (that is, the scribe lane region III). Scribe lane regions III and IV may be portions of a single scribe lane region II or be formed in separate scribe lane regions II.

As shown in FIG. 6, an insulation layer (or an isolation layer) 110 in at least one of the circuit region I, the scribe lane region III and the scribe lane region IV. In this case, the insulation layer 110 is formed on the substrate 100 so as to cover portions of side surfaces of the active fins F12 and F22 in the circuit region I and the scribe lane region III.

The gate structures 149a, 149b and 149c may be respectively formed in the circuit region I, the scribe lane region III and the scribe lane region IV. In detail, the gate structure 149a may be formed on the active fin F12 in the circuit region I, the gate structure 149b may be formed on the active fin F22 in the scribe lane region III, and the gate structure 149c may be directly formed on the insulation layer 110 in the scribe lane region IV. Alternatively, the gate structure 149c may be directly formed on substrate 100 (like gate structure 149b of FIG. 4). An active fin may not be formed under the gate structure 149c of the scribe lane region IV.

Referring to FIG. 6, in the semiconductor device according to another embodiment of the present inventive concept, a height of a bottom surface of the gate structure 149c in the scribe lane region IV may be lower than a height of a bottom surface of the gate structure 149b in the scribe lane region III. In view of the substrate 100, the height of the bottom surface of the gate structure 149c in the scribe lane region III may be a distance d3 smaller than the height of the bottom surface of the gate structure 149b in the scribe lane region III. In addition, a height of a top surface of the insulation layer 110 in the scribe lane region IV may be lower than a height of a top surface of the active fin F22 in the scribe lane region III. In this example, the height of the top surface of the insulation layer 110 in the scribe lane region IV is a distance d3 smaller than the height of the top surface of the active fin F22 in the scribe lane region III.

In some embodiments of the present inventive concept, the gate structures 149a, 149b and 149c respectively formed in the circuit region I, the scribe lane region III and the scribe lane region IV may be simultaneously formed by the same process or similar processes. In this case, due to the height difference d3, a length ranging from a top surface of the insulation layer 110 to a top surface of the gate structure 149c in the scribe lane region IV may be greater than a length ranging from the top surface of the active fin F22 to the top surface of the gate structure 149b in the scribe lane region III. FIG. 6 illustrates that the heights of the top surfaces of the gate structures 149a, 149b and 149c become identical with each other by performing a chemical mechanical polishing (CMP) process on the gate structures 149a, 149b and 149c having the height difference d3. However, the heights of the top surfaces may differ due to deviations in the manufacturing processes, such as a dishing phenomenon during the CMP process.

As shown in FIG. 6, in the semiconductor device according to an embodiment of the present inventive concept, even when the scribe lane region III or IV including monitoring patterns is etched to damage the monitoring patterns, portions of the monitoring patterns remain. Accordingly, alignment of upper and lower layers may be performed using the monitoring pattern remaining in the scribe lane region IV. Even if the monitoring patterns formed in the scribe lane region IV are damaged severely enough to almost entirely etch the actual patterns formed in the circuit region I and the scribe lane region III, a considerable amount of the monitoring patterns may still remain, thereby providing the monitoring patterns having increased reliability.

Referring again to FIG. 5, the monitoring patterns in the scribe lane region may include the first monitoring patterns 211, 213, 215 and 217, the second monitoring patterns 221, 223, 225 and 227 and the third monitoring patterns 231, 233, 235 and 237. In the following description, for the sake of convenient explanation, it is assumed that a portion of the scribe lane region having the third monitoring patterns 231, 233, 235 and 237 is referred to by a scribe lane region V. Scribe lane region V may be formed together with one or both of scribe lane regions III and IV in the same scribe lane region II or in separate scribe lane regions II.

Figure 7:
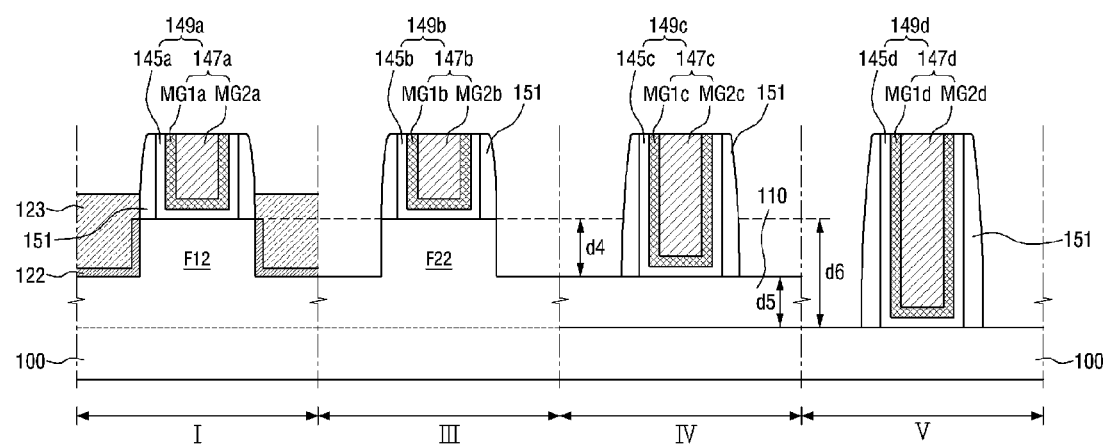
FIG. 7 is a cross-sectional view of a semiconductor device according to still another embodiment of the present inventive concept.

FIG. 7 is a cross-sectional view of a semiconductor device according to still another embodiment of the present inventive concept.

Referring to FIGS. 5 and 7, the semiconductor device according to still another embodiment of the present inventive concept may include a circuit region I, a scribe lane region III, a scribe lane region IV and a scribe lane region V. The scribe lane region III shown in FIG. 7 may correspond to a cross section taken along the line C-C of FIG. 5, the scribe lane region IV shown in FIG. 7 may correspond to a cross section taken along the line D-D of FIG. 5, and the scribe lane region V shown in FIG. 7 may correspond to a cross section taken along the line E-E of FIG. 5.

In the semiconductor device according to still another embodiment of the present inventive concept, active fins F12 and F22 may be formed in the circuit region I and the scribe lane region III but may not be formed in the scribe lane regions IV and V. Similar to the semiconductor device according to the previous embodiment shown in FIG. 6, in the semiconductor device according to the embodiment of FIG. 7, the active fin F22 may formed in a portion of a scribe lane region II (that is, the scribe lane region III). In this case, the insulation layer 110 is formed on the substrate 100 so as to cover portions of lateral surfaces of the active fins F12 and F22 in the circuit region I and the scribe lane region III. However, the semiconductor device according to still another embodiment of the present inventive concept is different from the semiconductor device according to the previous embodiment shown in FIG. 6 in that the insulation layer 110 is formed in a portion of the scribe lane region (that is, the scribe lane region IV) but is not formed in another portion of the scribe lane region (that is, the scribe lane region V).

Gate structures 149a, 149b, 149c and 149d may be formed in all of the circuit region I, the scribe lane region III, the scribe lane region IV and the scribe lane region V. In detail, the gate structure 149a may be formed on the active fin F12 in the circuit region I, the gate structure 149b may be formed on the active fin F22 in the scribe lane region III, the gate structure 149c may be directly formed on the insulation layer 110 in the scribe lane region IV, and the gate structure 149d may be formed on the substrate 100 in the scribe lane region V. The insulation layer 110 may be formed under the gate structure 149c of the scribe lane region IV while the active fin is not formed under the gate structure 149c of the scribe lane region IV, and the active fin and the insulation layer 110 may not be formed under the gate structure 149d of the scribe lane region V.

Referring to FIG. 7, in the semiconductor device according to another embodiment of the present inventive concept, a height of a bottom surface of the gate structure 149d of the scribe lane region V may be lower than a height of a bottom surface of the gate structure 149c of the scribe lane region IV, and the height of the bottom surface of the gate structure 149c of the scribe lane region IV may be lower than a height of a bottom surface of the gate structure 149b in the scribe lane region III. In view of the substrate 100, the height of the bottom surface of the gate structure 149d of the scribe lane region V may be a distance d5 lower than the height of the bottom surface of the gate structure 149c of the scribe lane region IV, and the height of the bottom surface of the gate structure 149c of the scribe lane region IV may be a distance d4 lower than the height of the bottom surface of the gate structure 149b in the scribe lane region III. The height of the bottom surface of the gate structure 149d of the scribe lane region V may be a distance d6 lower than the height of the bottom surface of the gate structure 149b in the scribe lane region III where it overlies Fin F22 and a distance d6 lower than the height of the bottom surface of the gate structure 149a in the scribe lane region I where it overlies fin F12.

The height of the top surface of the insulation layer 110 in the scribe lane region IV may be a distance d4 lower than the height of the top surface of the active fin F22 in the scribe lane region III, and the height of the top surface of the substrate 100 in the scribe lane region V may be a distance d5 lower than the height of the top surface of the insulation layer 110 in the scribe lane region IV. The height of the top surface of the substrate 100 in the scribe lane region V may be a distance d6 lower than the height of the top surface of the active fin F22 in the scribe lane region III.

Even when the scribe lane regions III, IV and V including monitoring patterns are damaged (e.g., due to an etching process), portions of the monitoring patterns formed in the scribe lane regions IV and V may remain. Accordingly, alignment of upper and lower layers may be performed using the monitoring pattern remaining in the scribe lane regions IV and V. Monitoring patterns having increased reliability may therefore be obtained.

FIGS. 8 to 14 illustrate process steps of a method for fabricating a semiconductor device according to an embodiment of the present inventive concept. Such steps may be used in fabricating the embodiments described herein.

Figure 8:
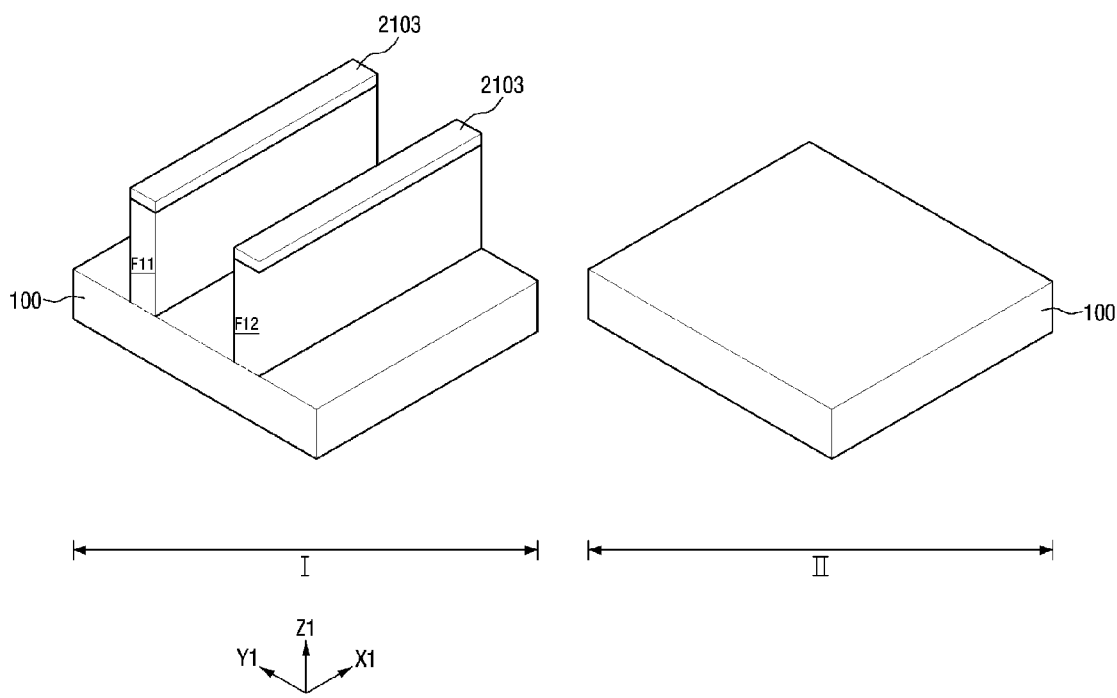
FIGS. 8 to 14 illustrate intermediate process steps for explaining a method for fabricating a semiconductor device according to an embodiment of the present inventive concept.

Referring to FIG. 8, the substrate 100 having the circuit region I and the scribe lane region II is provided, and the active fins F11 and F12 are formed on the substrate 100 only in the circuit region I and not in the scribe lane region II. In some embodiments active fins may be formed in the scribe lane region, like the active fins 22 as shown in FIGS. 6 and 7.

A mask pattern 2103 is formed on the substrate 100 of the circuit region I, and the substrate is selectively etched corresponding to holes the mask pattern 2103 to form the active fins F11 and F12. The active fins F11 and F12 may be adjacent to each other. Here, the active fins F11 and F12 extend in the second direction X1. The mask pattern 2103 may include at least one of a silicon oxide layer, a silicon nitride layer and a silicon oxynitride layer. Meanwhile, trenches may be formed in vicinity of the active fins F11 and F12 (such as between the active fins F11 and F12 as shown) corresponding to the holes in the mask pattern 2103.

Figure 9:
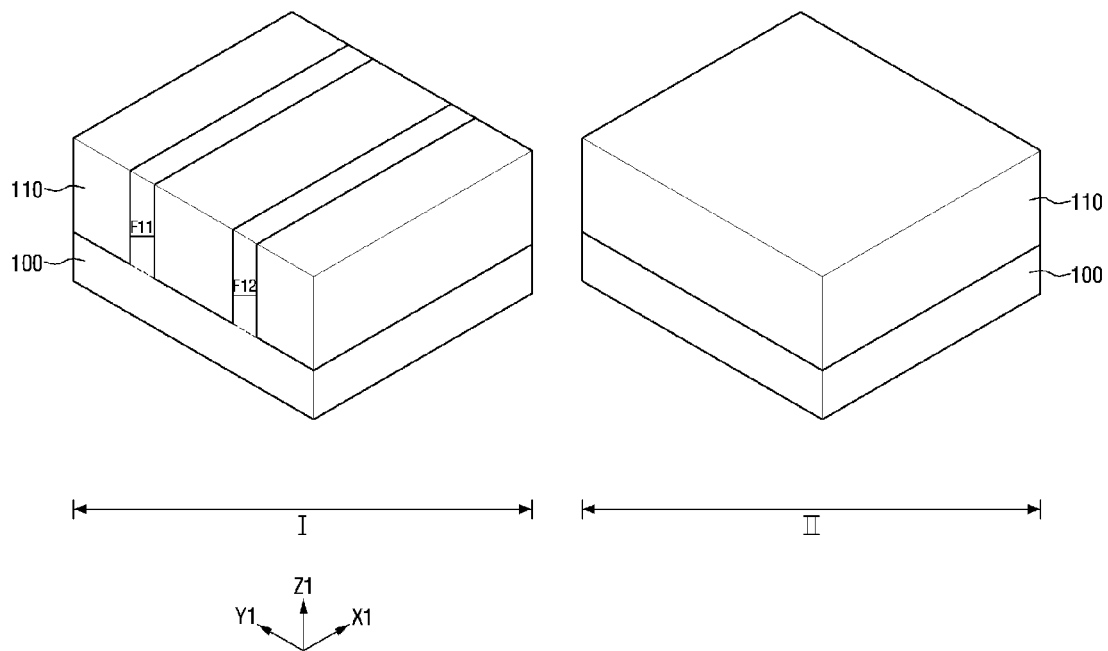

Referring to FIG. 9, an insulation layer (or an isolation layer) 110 is formed in the circuit region I and the scribe lane region II. In the circuit region I, the insulation layer 110 may be formed to fill the trenches. The insulation layer 110 may include at least one of a silicon oxide layer, a silicon nitride layer and a silicon oxynitride layer. The insulation layer 110 may be deposited to fill the trenches and overlie the active fins F11 and F12 and the mask pattern 2103. A CMP process may be performed to remove upper portions of the insulating layer 110 and the mask pattern 2103 so that upper portions of the active fins F11 and F12 are exposed. Alternatively, fins F11 and F12 may be formed in insulation layer 110 by blanket depositing an insulation layer 110 over substrate 100 and etching trenches to expose portions of substrate 100 at locations corresponding to fins F11 and F12.

Figure 10:
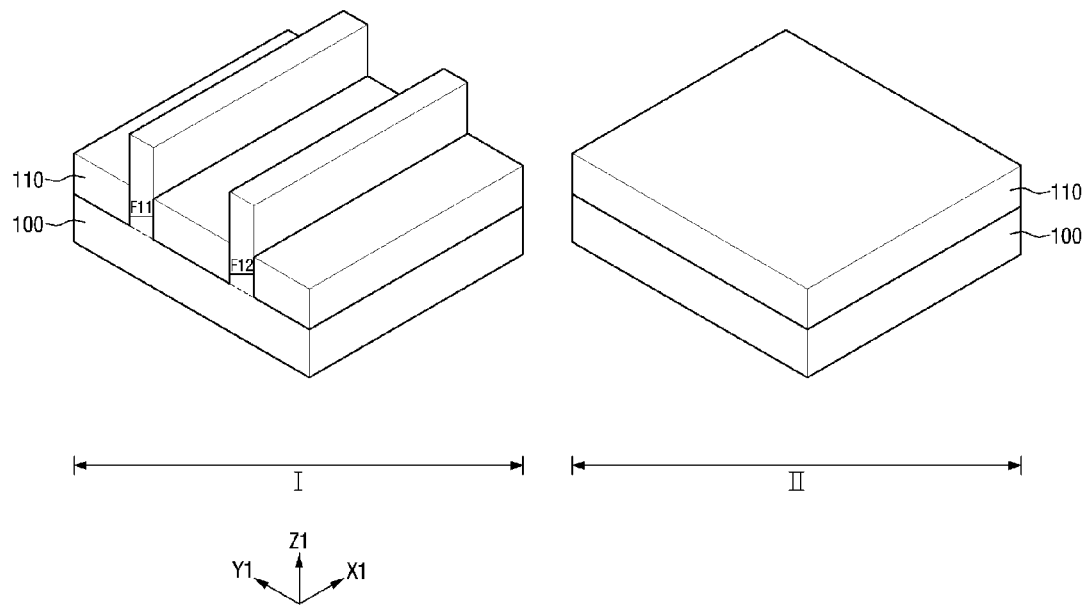

Referring to FIG. 10, in the circuit region I and the scribe lane region II, a top portion of the insulation layer 110 is removed by a selective etching processed. Accordingly, top portions of the active fins F11 and F12 are exposed in the circuit region I. It should be noted that the mask pattern 2103 may be removed before recessing the insulation layer 110, during the selective recessing of the insulating layer 110 or after the selective recessing of the insulating layer 110.

In some embodiments, in the circuit region I, portions of active fins F11 and F12 protruding above the insulating layer 110 may be formed by an epitaxial process, For example, after forming the insulating layer 110, the portions of the active fins F11 and F12 may be formed by the epitaxial growing process using as seeds the top surfaces of the active pattern fins F11 and F12 exposed by the insulating layer 110 without a recessing process.

In addition, doping of an impurity for controlling a threshold voltage may be performed on the active fins F11 and F12. For example, in a case of forming an NMOS transistor, the impurity may be boron (B), and in a case of forming a PMOS transistor, the impurity may be phosphorus (P) or arsenic (As).

Figure 11:
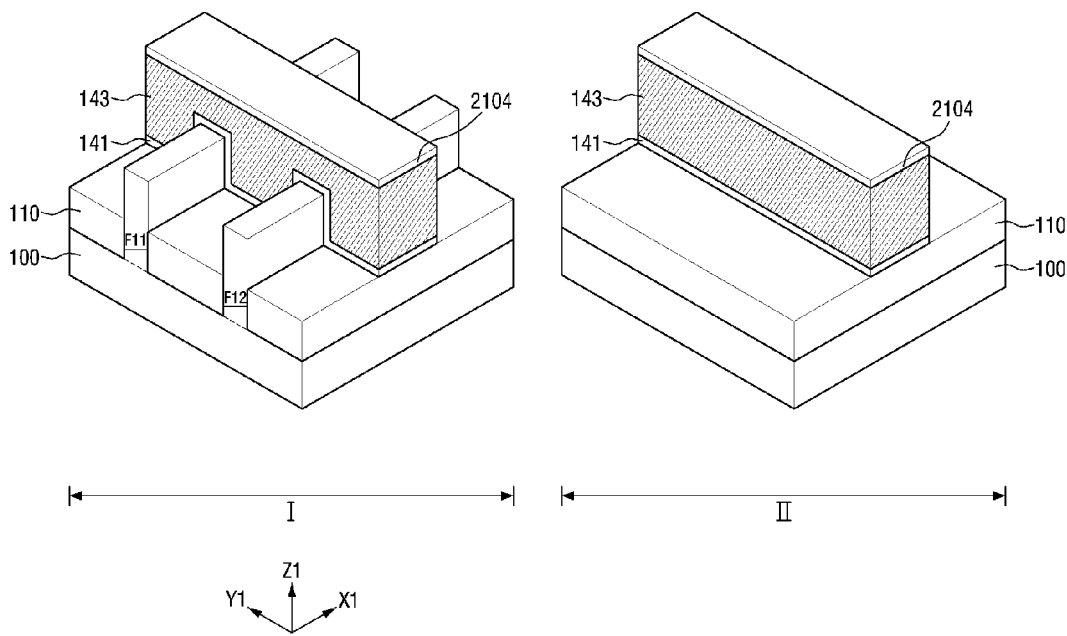

Referring to FIG. 11, in the circuit region I and the scribe lane region II, an etching process is performed using the mask pattern 2104, thereby forming a dummy gate insulation layer 141 and a dummy gate electrode 143 extending in a third direction Y1 while crossing the active fins F11 and F12. For example, a dummy gate insulation layer and a dummy gate electrode layer may be deposited and patterned via mask pattern 2104 (which may be patterned as a hard mask on the dummy gate electrode) to form the dummy gate insulation layers 141 and dummy gate electrodes 143. In some embodiments of the present inventive concept, the dummy gate insulation layer 141 may include silicon oxide and the dummy gate electrode 143 may include polysilicon.

Figure 12:
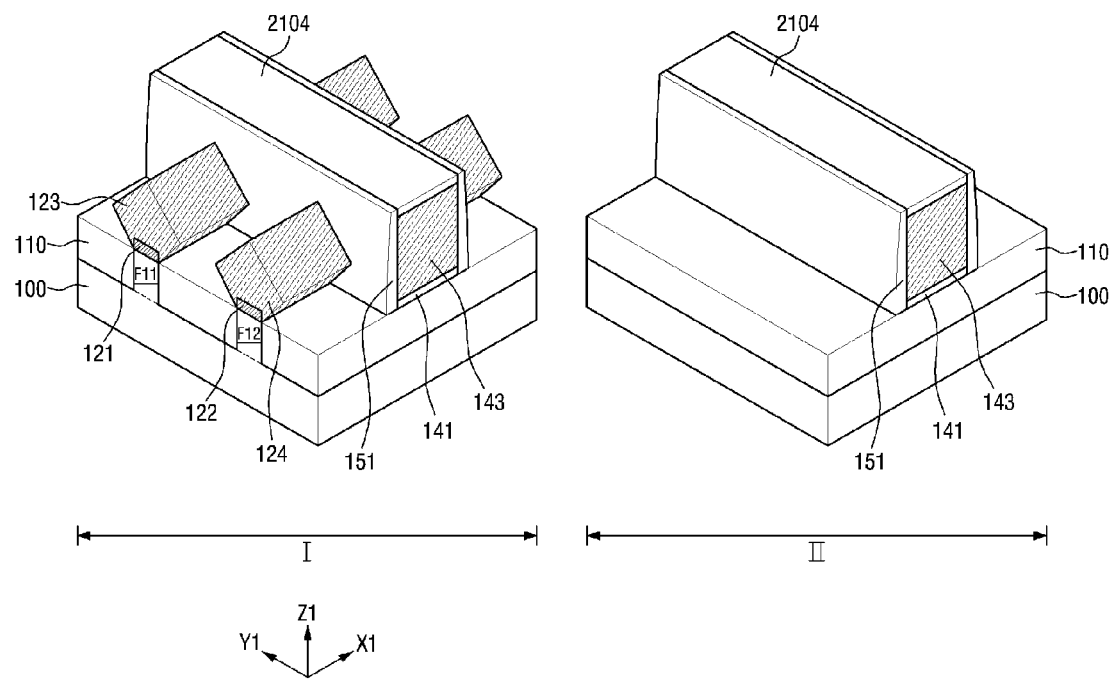

Referring to FIG. 12, in the circuit region I and the scribe lane region II, spacers 151 may be formed on sidewalls of the dummy gate electrodes 143. The spacers 151 may be formed by depositing a spacer layer and etching the same to expose top surfaces of the mask patterns 2104 as well as underlying layers, such as insulating layer 110 and fins F11 and F12. Here, the spacers 151 may comprise a silicon nitride layer or a silicon oxynitride layer. In some embodiments of the present inventive concept, portions of the active fins F11 and F12 exposed at opposite sides of the dummy gate electrode 143 may be recessed (here, recessed to a height similar to the height of the top surface of the insulation layer 110). Then, after seed layers 121 are formed on exposed top surfaces of the active fins F11 and F12 (e.g., corresponding to the recessed portions of fins F11 and F12). The seed layers 121 and 122 may be used as seeds in epitaxially growing regions 123 and 124. Regions 123 and 134 may be doped (either after their growth or in situ with their growth) and may correspond to source/drain (S/D) regions of transistors formed by this process. In some embodiments of the present inventive concept, cross sectional shapes of the doping regions 123 and 124 may be a diamond, a circle, a pentagon, a hexagon or a rectangle. In FIG. 12, a diamond shape is illustrated.

Figure 13:
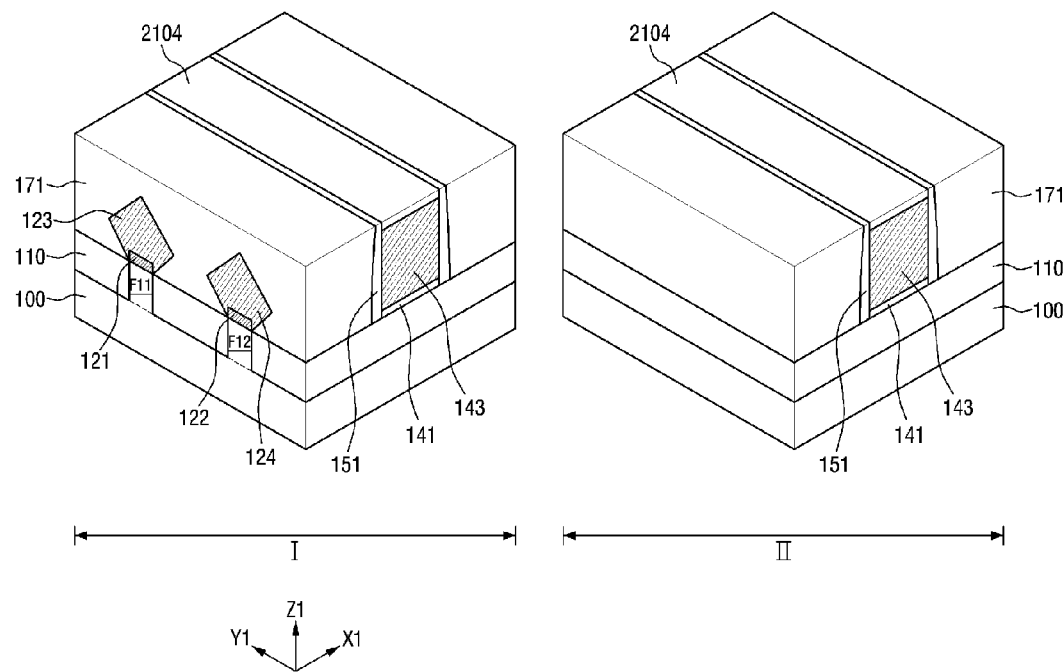
Figure 14:
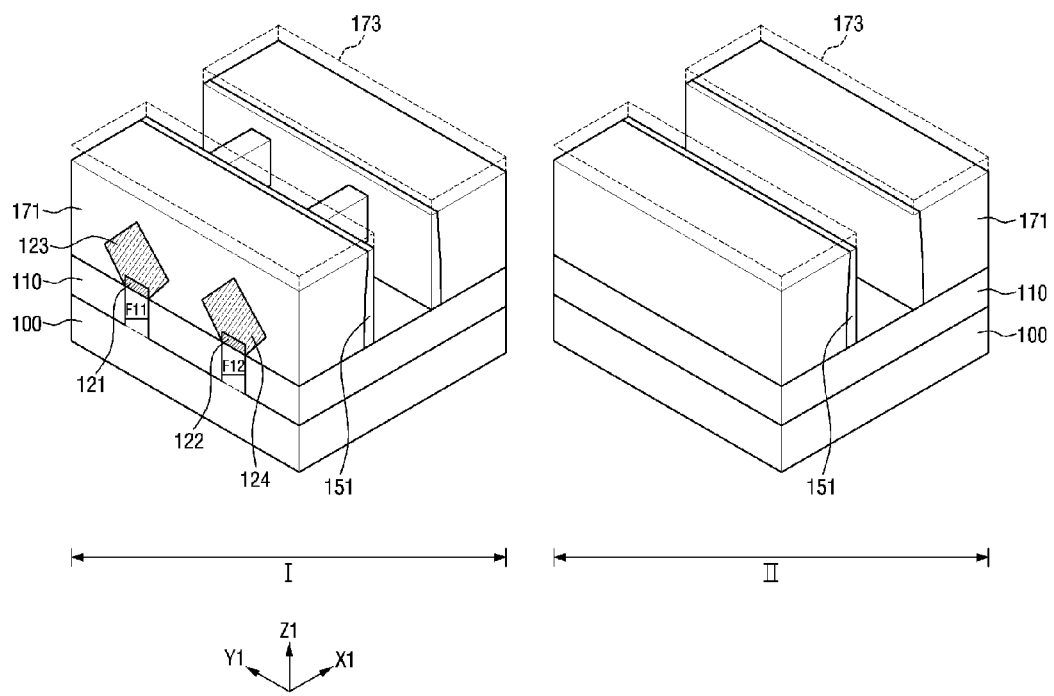

Referring to FIGS. 13 and 14, in the circuit region I and the scribe lane region II, an interlayer insulation layer 171 is formed on the resultant product shown in FIG. 12. The interlayer insulation layer 171 may be, for example, at least one of an oxide layer, a nitride layer and an oxynitride layer. Next, the interlayer insulation layer 171 is planarized until a top surface of the mask pattern 2104 is exposed and the mask pattern 2104 may be removed by a subsequent selective etch process. Alternatively, the planarization may continue until the top surface of the dummy gate electrode 143 is exposed. As the result, the mask pattern 2104 is removed, and the top surface of the dummy gate electrode 143 is exposed. Next, the dummy gate insulation layer 141 and the dummy gate electrode 143 are removed by a selective etch process. As the dummy gate insulation layer 141 and the dummy gate electrode 143 are removed, a trench exposing the insulation layer 110 is formed.

Referring again to FIG. 1, in the circuit region I and the scribe lane region II, the gate insulation layers 145a and 145b and the gate electrodes 147a and 147b are formed in the trench. For example, the gate insulation layer material(s) and gate electrode material(s) may be sequentially deposited over the structure illustrated in FIG. 14 and subjected to a CMP process to remove portions outside of the trench. FinFET transistors may be formed in the circuit region I with the structure of FIG. 1. Source/drain regions may be formed by doped regions 123 and 124 (which may be raised epitaxially grown regions on the previously recessed portions of active fins F11 and F12). A first transistor may be formed by two source/drain regions 123 on either side of gate structure 149a, a channel region comprising a portion of the fin F11 under the gate electrode 149a, and a gate formed by the portion of gate structure 149a over and along sidewalls of fin F11. A second transistor may be formed by two source/drain regions 124 on either side of gate structure 149b, a channel region comprising a portion of the fin F11 under the gate structure 149b, and a gate formed by the portion of gate structure 149b over and along sidewalls of fin F12. A single larger transistor may be formed by providing electrical connections between the adjacent source/drain regions of the above noted first and second transistors.

The gate insulation layers 145a and 145b may include a high-k material having a higher dielectric constant than a silicon oxide layer. In detail, the gate insulation layers 145a and 145b may include, for example, one or more materials selected from the group consisting of HfSiON, HfO$_2$, ZrO$_2$, Ta$_2$O$_5$, TiO$_2$, SrTiO$_3$, BaTiO$_3$, and SrTiO$_3$. Each of the gate insulation layers 145a and 145b may be formed to an appropriate thickness according to the type of device to be formed. For example, when the gate insulation layers 145a and 145b include HfO$_2$, they may be formed to a thickness of approximately 50 Å or less (in a range between approximately 5 Å and 50 Å), but aspects of the present inventive concept are not limited thereto.

Figure 15:
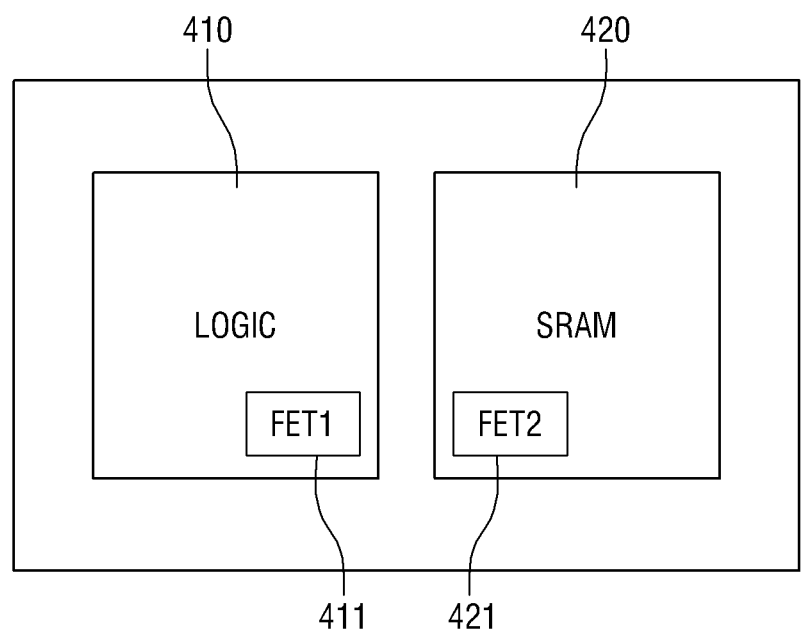
FIGS. 15 and 16 are diagrams for explaining semiconductor devices fabricated by a method fabricating a semiconductor device according to an embodiment of the present inventive concept.
Figure 16:
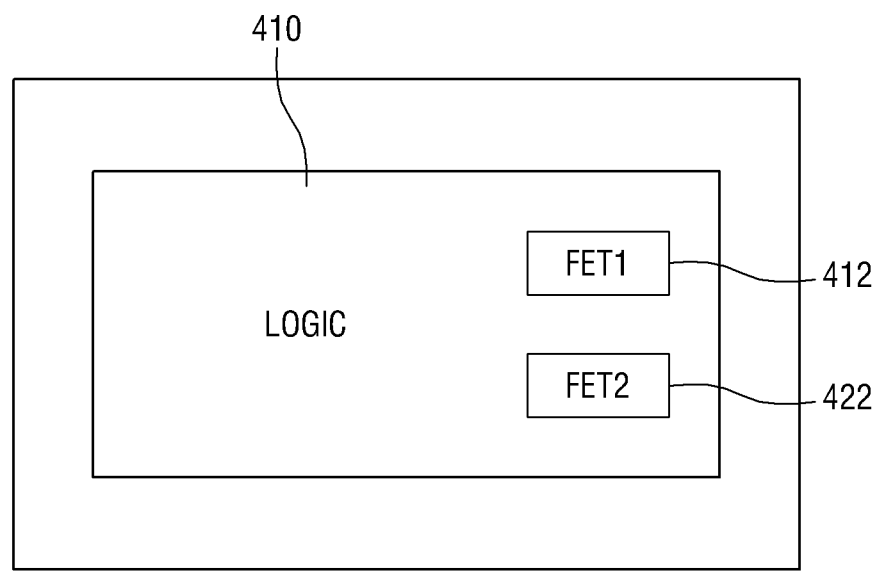

The gate electrodes 147a and 147b may include metal layers MG1a and MG2a. For example, the metal layer MG1a may include at least one selected from the group consisting of Mo, Pd, Ru, Pt, TiN, WN, TaN, Ir, TaC, RuN, TiAl, TaAlC, TiAlN, and MoN, but aspects of the present inventive concept are not limited thereto. In addition, the metal layer MG2a may include a conductive material, for example, W or Al, but aspects of the present inventive concept are not limited thereto. Meanwhile, in some embodiments of the present inventive concept, the gate electrodes 147a and 147b may include a non-metal element, such as Si, or SiGe. While the gate electrodes 147a and 147b have been described as being formed by a replacement process, aspects of the present inventive concept are not limited thereto. For example, the dummy gate insulation layer 141 and the dummy gate electrode 143 may not constitute dummy elements but may instead remain and form the real gate insulation layer and real gate electrodes (e.g., may form gate insulation layers 145a and 145b and gate electrodes 147a and 147b). FIGS. 15 and 16 are diagrams for explaining semiconductor devices fabricated by a method fabricating a semiconductor device according to an embodiment of the present inventive concept. The following description will focus on differences between the present and previous embodiments.

First, referring to FIG. 15, a semiconductor device 13 is shown that may correspond to the circuit regions I described with respect to the embodiments disclosed here (such as circuit region I of the FIG. 1 or circuit region I fabricated by the methods described herein). The semiconductor device 13 may include a logic region 410 and an SRAM region 420. A transistor 411 may be disposed in the logic region 410 and a transistor 421 may be disposed in the SRAM forming region 420. Both of the transistors 411 and 421 may be finFET transistors formed in a circuit region I, e.g., as described above. Alternatively, one of transistors 411 and 421 may be a finFET transistor formed in circuit region I, e.g., as described above, and the other may not be a finFET transistor (e.g., may be a planar finFET transistor).

Next, referring to FIG. 16, a semiconductor device 14 may include a logic region 410 (e.g., such as that shown in FIG. 15), and transistors 412 and 422 formed in the logic region 410. Both of the transistors 412 and 422 may be finFET transistors formed in a circuit region I, e.g., as described above. Alternatively, one of transistors 412 and 422 may be a finFET transistor formed in circuit region I, e.g., as described above, and the other may not be a finFET transistor (e.g., may be a planar finFET transistor).

Alternatively, transistors 412 and 422 may be formed in the SRAM region 420 shown in FIG. 13. In FIG. 16, the logic region 410 and the SRAM forming region 420 are illustrated, but aspects of the present inventive concept are not limited thereto. For example, the present inventive concept may also be applied to the logic region 410 and a region where other types of memories are formed (e.g., DRAM, MRAM, RRAM, PRAM, etc.).

Figure 17:
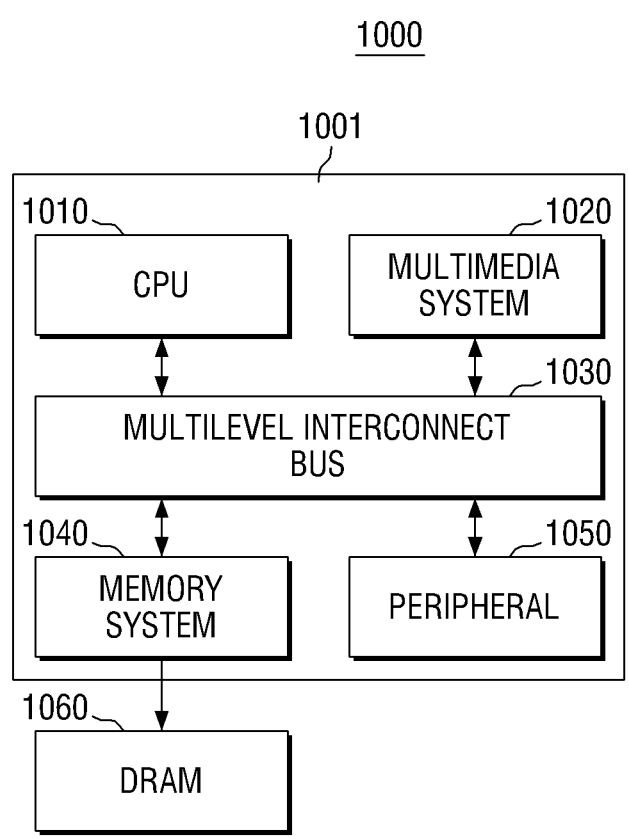
FIG. 17 is a block diagram of an SoC system according to embodiments of the present inventive concept.

FIG. 17 is a block diagram of an SoC system according to embodiments of the present inventive concept.

Referring to FIG. 17, the SoC system 1000 may include an application processor (AP) 10001 and a DRAM 1060.

The AP 1001 may include a central processing unit 1010, a multimedia system 1020, a bus 1030, a memory system 1040, and a peripheral circuit 1050.

The central processing unit 1010 may perform operations necessary for operating the SoC system 1000. In some embodiments of the present inventive concept, the central processing unit 1010 may be configured in a multi-core environment including a plurality of cores.

The multimedia system 1020 may be used in performing a variety of multimedia functions in the SoC system 1000. The multimedia system 1020 may include a 3D engine module, a video codec, a display system, a camera system, and a post-processor.

The bus 1030 may be used in performing data communication among the central processing unit 1010, the multimedia system 1020, the memory system 1040, and the peripheral circuit 1050. In some embodiments of the present inventive concept, the bus 1030 may have a multi-layered structure. In detail, examples of the bus 1030 may include a multi-layer advanced high-performance bus (AHB), or a multi-layer advanced eXtensible interface (AXI), but aspects of the present inventive concept are not limited thereto.

The memory system 1040 may provide environments necessary for high-speed operation by connecting the AP 1001 to an external memory (for example, the DRAM 1060). In some embodiments of the present inventive concept, the memory system 1040 may include a separate controller (for example, a DRAM controller) for controlling the external memory (for example, the DRAM 1060).

The peripheral circuit 1050 may provide environments necessary for smoothly connecting the SoC system 1000 to an external device (for example, a main board). Accordingly, the peripheral circuit 1050 may include various kinds of interfaces enabling the external device connected to the SoC system 1000 to be compatibly used.

The DRAM 1060 may function as a working memory required to operate the AP 1001. In some embodiments of the present inventive concept, as shown, the DRAM 1060 may be disposed outside the AP 1001. In detail, the DRAM 1060 may be packaged with the AP 1001 in the form of a package on package (PoP). Each of the central processing unit 1010, the multimedia system 1020, the memory system 1040, the peripheral circuit 1050 and DRAM 1060 may be embodied by one or more semiconductor chips, at least some of which may include the device structure of an embodiment described herein or manufactured according to an embodiment described herein (e.g, be comprised of a plurality of interconnected finFET transistors formed in a circuit region I and/or manufactured using monitoring patterns formed in a scribe lane region II).

Figure 18:
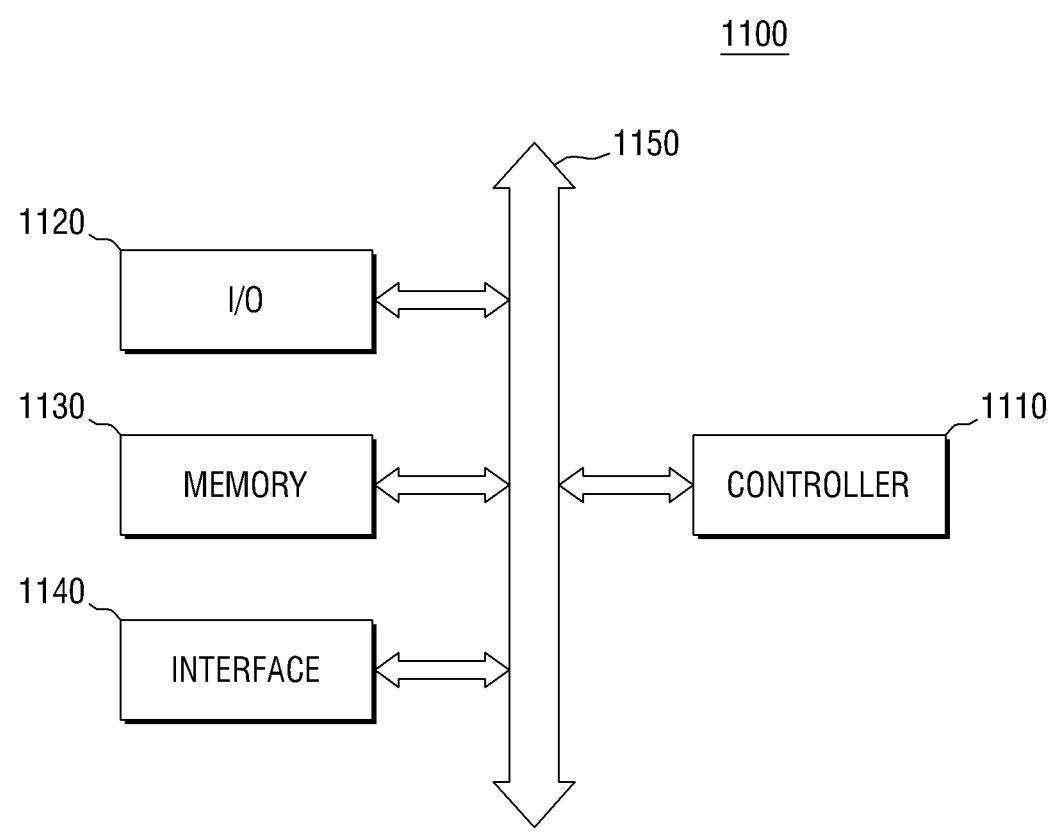
FIG. 18 is a block diagram of an electronic system according to embodiments of the present inventive concept.

FIG. 18 is a block diagram of an electronic system according to embodiments of the present inventive concept.

Referring to FIG. 18, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1100 may further include high-speed DRAM and/or SRAM as the working memory for improving the operation of the controller 1110. Here, the semiconductor device 98b according to the embodiment of the present inventive concept may be employed as the working memory. In addition, the semiconductor device 98b according to the embodiment of the present inventive concept may be provided in the memory device 1130 or may be provided some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment. Each of the controller 1110, the input/output device (I/O) 1120, the memory device 1130 and the interface 1140 may be embodied by one or more semiconductor chips, at least some of which may include the device structure of an embodiment described herein or manufactured according to an embodiment described herein (e.g, be comprised of a plurality of interconnected finFET transistors formed in a circuit region I and/or manufactured using monitoring patterns formed in a scribe lane region II).

Figure 19:
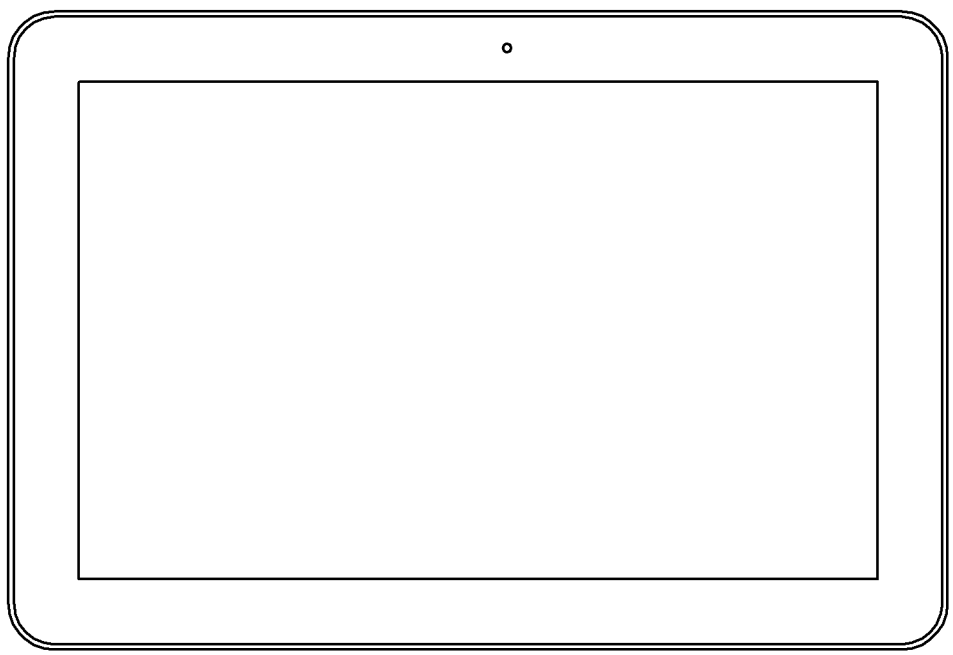
FIGS. 19 to 21 illustrate an exemplary semiconductor system according to some embodiments of the present inventive concept.
Figure 20:
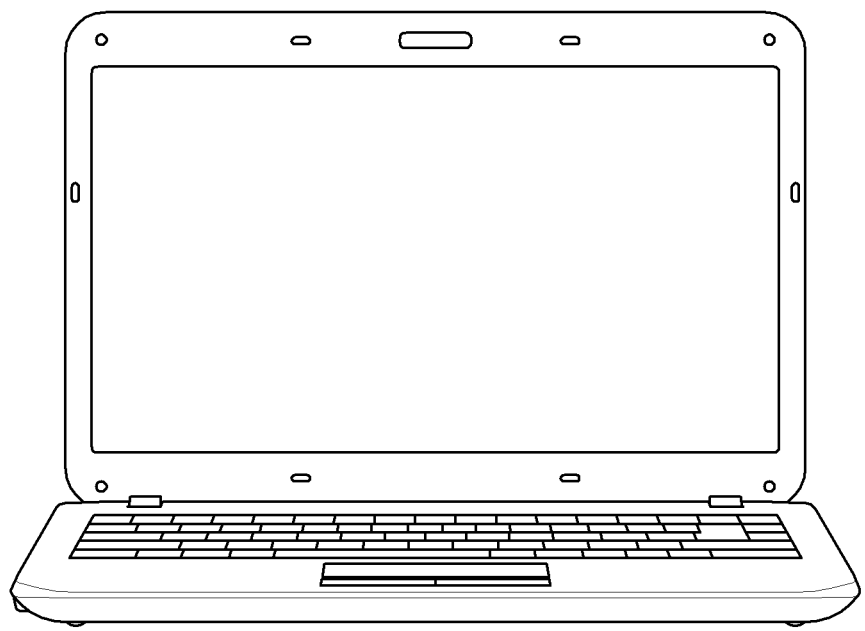
Figure 21:
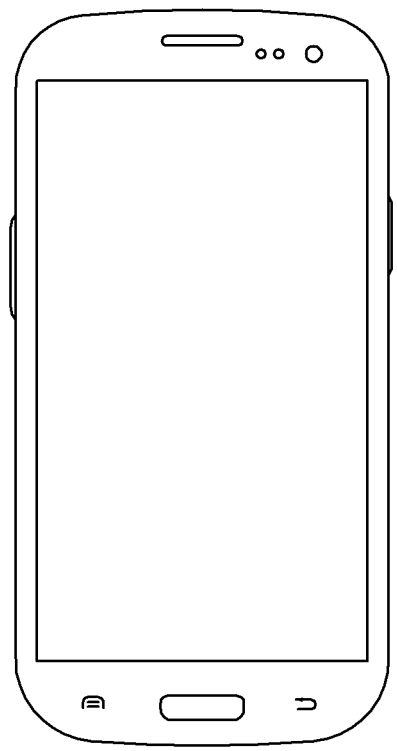

FIGS. 19 to 21 illustrate an exemplary semiconductor system to which semiconductor devices according to some embodiments of the present inventive concept can be employed. FIG. 19 illustrates an example in which a semiconductor device according to an embodiment of the present inventive concept is applied to a tablet PC (1200), FIG. 20 illustrates an example in which a semiconductor device according to an embodiment of the present inventive concept is applied to a notebook computer (1300), and FIG. 21 illustrates an example in which a semiconductor device according to an embodiment of the present inventive concept is applied to a smart phone (1400). At least one of the semiconductor devices described herein according to some embodiments of the present inventive concept may used to form the tablet PC, the notebook computer, the smart phone, and the like.

It is obvious to one skilled in the art that the semiconductor devices according to some embodiments of the present inventive concept may also be applied to other IC devices not illustrated herein. In the above-described embodiments, only the tablet PC 1200, the notebook computer 1300 and the smart phone 1400 have been exemplified as the semiconductor devices according to the embodiments of the present inventive concept, but aspects of the present inventive concept are not limited thereto. In some embodiments of the present inventive concept, the semiconductor device may be implemented as a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

While the present inventive concept has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A method of manufacturing a semiconductor device, comprising:

providing a semiconductor wafer, the semiconductor wafer comprising at least a first circuit region and a first scribe lane adjacent the first circuit region; and separating the first circuit region from the wafer to provide the semiconductor device, including providing a separation along the first scribe lane, wherein, the first circuit region comprises:

a first portion of a substrate provided with a first fin shaped active region and a second fin shaped active region, the first fin shaped active region adjacent the second fins shaped region defining a trench there between, a first portion of a device isolation insulating layer formed over the substrate having a height lower than top surfaces of the first fin shaped active region and the second fin shaped active region, and formed on sidewalls of the first fin shaped active region, sidewalls of the second fin shaped active region and in the trench formed between the first fin shaped active region and the second fin shaped active region, a first gate structure formed to cross over top surfaces of the first fin shaped active region and the second fin shaped active region and the first portion of the device isolation insulating layer in the trench, wherein the first scribe lane region comprises:

a second portion of the substrate, a second portion of the device isolation insulating layer formed over the second portion of the substrate and a monitoring pattern comprising a second gate structure, wherein the first gate structure and the second gate structure are formed from the same material layers, a height of a bottom surface of the second gate structure of the first scribe lane region is lower than a height of a bottom surface of the first gate structure of the first circuit region, which is disposed on the top surfaces of the first and second fin shaped active regions, and the second gate structure is directly formed on the second portion of the device insulating layer in the first scribe lane region.

2. The method of claim 1, wherein a distance from a top surface of the second portion of the device isolation insulating layer to the top surface of the second gate structure in the first scribe lane region is greater than a distance from the top surface of the first fin shaped active region to the top surface of the first gate structure in the first circuit region.

3. The method of claim 1 wherein a height of the top surface of the second portion of the device isolation insulation layer in the scribe lane region is lower than a height of the top surface of the first fin shaped active region in the first circuit region.

4. The method of claim 1, wherein the first gate structure and the second gate structure extend in the same direction or in respective directions that are orthogonal to each other.

5. A method of manufacturing a semiconductor device comprising:

providing a semiconductor substrate with a circuit region and a scribe lane region adjacent the circuit region;

forming a fin shaped active region in the circuit region;

forming a first insulating layer on surfaces of the semiconductor substrate and on lower portions of sidewalls of the fin shaped active region;

forming a first dummy gate structure over the fin shaped active region and a second dummy gate structure in the scribe lane region;

forming sidewall spacers along sidewalls of the first dummy gate structure and along sidewalls of the second dummy gate structure;

forming a second insulating layer on the first insulating layer and on sides of the sidewall spacers;

forming a first trench in the circuit region and a second trench in the scribe lane region by removing the first and second dummy gate structures;

depositing a gate insulation layer in the first trench in the circuit region and the second trench in the scribe region;

depositing a gate electrode layer on the gate insulation layer in the first trench in the circuit region and the second trench in the scribe region; and forming a first gate electrode structure from first portions of the gate insulation layer and the gate electrode layer in the circuit region and a second gate electrode structure from second portions of the gate insulation layer and the gate electrode layer in the scribe lane region, wherein the second gate electrode does not overlie any active region.

6. The method of claim 5, wherein the second gate electrode is formed directly on the semiconductor substrate.

7. The method of claim 5, wherein the insulating layer is formed in the scribe lane region and the second gate electrode is formed directly on the first insulating layer.

8. The method of claim 5, wherein a bottom surface of the second gate electrode is lower than a bottom surface of the first gate electrode on the fin shaped active region.

9. The method of claim 5, wherein depositing the gate insulation layer and the gate electrode layer comprises depositing the gate insulation layer and the gate electrode layer on the second insulating layer, and the method further comprises, after depositing the gate electrode layer in the first trench and the second trench, performing a chemical mechanical polishing to remove the portions of the gate insulation layer and the gate electrode layer on the second insulating layer.

10. The method of claim 5, further comprising using the second gate electrode to align the formation of subsequent layers on the circuit region.

11. The method of claim 5, wherein the gate insulation layer is deposited on a top surface of the fin shaped active region, upper portions of sidewalls of the fin shaped active region.

12. The method of claim 5, further comprising forming a third gate electrode structure from third portions of the gate insulation layer and the gate electrode layer in the scribe lane region, wherein the second gate electrode structure and the third gate electrode structure form elements of a monitoring pattern.

13. The method of claim 12, wherein lengthwise directions of the second and third electrode structures extend in directions perpendicular to each other.

14. The method of claim 12, wherein the third electrode structure does not overlie any active region.

* * * * *